United States Patent [19]
Gosain et al.

[11] Patent Number: 5,567,633
[45] Date of Patent: Oct. 22, 1996

[54] METHOD FOR PRODUCING A THIN FILM TRANSISTOR HAVING IMPROVED CARRIER MOBILITY CHARACTERISTICS AND LEAKAGE CURRENT CHARACTERISTICS

[75] Inventors: Dharam P. Gosain; Jonathan Westwater; Setsuo Usui, all of Kanagawa, Japan

[73] Assignee: Sony Corporation, Tokyo, Japan

[21] Appl. No.: 412,946

[22] Filed: Mar. 29, 1995

[30] Foreign Application Priority Data

Mar. 31, 1994 [JP] Japan ................................. 6-087799

[51] Int. Cl.⁶ ........................................... H01L 21/786
[52] U.S. Cl. ........................ 437/40; 437/24; 437/41; 437/162; 437/937
[58] Field of Search ............... 437/40 TFI, 41 TFI, 437/24, 162, 937; 148/DIG. 150

[56] References Cited

U.S. PATENT DOCUMENTS

| | | | |
|---|---|---|---|
| 5,075,237 | 12/1991 | Wu | 437/40 TFI |
| 5,395,804 | 3/1995 | Ueda | 437/937 |
| 5,401,685 | 3/1995 | Ha | 437/937 |
| 5,403,756 | 4/1995 | Yoshinouchi et al. | 437/24 |

FOREIGN PATENT DOCUMENTS

| | | | |
|---|---|---|---|
| 3132074 | 6/1991 | Japan | 437/911 |
| 3219643 | 9/1991 | Japan | 437/225 |
| 3293731 | 12/1991 | Japan . | |
| 4186634 | 7/1992 | Japan | 437/238 |
| 4206836 | 7/1992 | Japan | 437/24 |

*Primary Examiner*—T. N. Quach
*Assistant Examiner*—Michael Trinh
*Attorney, Agent, or Firm*—Hill, Steadman & Simpson

[57] ABSTRACT

A polycrystalline silicon film formed of an active layer of a thin film transistor is entirely hydrogenated by a low-temperature process, thereby lowering the resistance and relaxing the electric field in the vicinity of the drain to reduce the leakage current. A gate and an insulating film that covers it are formed on a substrate having an insulating surface. A hydrogenated polycrystalline silicon film is formed over the substrate, including the gate, with the insulating film interposed therebetween. A silicon oxide film pattern is formed on the polycrystalline silicon film directly above the gate. Source/drain regions are formed on the polycrystalline silicon film substantially at two external sides of the silicon oxide film pattern. The source/drain regions are formed from a hydrogen-containing amorphous silicon film, a conductive silicon film and a metal film, which are successively stacked on the polycrystalline silicon film. Accordingly, the hydrogen-containing amorphous silicon film functions as an offset region.

4 Claims, 6 Drawing Sheets ion implantation

METHOD FOR PRODUCING A THIN FILM TRANSISTOR HAVING IMPROVED CARRIER MOBILITY CHARACTERISTICS AND LEAKAGE CURRENT CHARACTERISTICS

BACKGROUND OF THE INVENTION

1. Field of the Invention

The present invention relates to a thin film transistor and a method of producing the same.

2. Description of the Related Art

In recent years, thin film transistors (TFTs) using a polycrystalline silicon (hereinafter referred to as "poly-Si") film, i.e., poly-Si TFTs, have been employed as active circuit elements in LCDs, SRAMs, etc. There have been various reports on methods of forming a TFT using a poly-Si film subjected to laser crystallizing treatment as an active layer.

The method that employs laser crystallizing treatment enables a TFT to be formed on a low-cost glass substrate by a low-temperature process. With a method wherein an amorphous silicon layer is crystallized by using excimer laser light, crystal grains cannot be grown larger than about 10 nm, and hence the number of grain boundaries is undesirably large. Therefore, the crystallized silicon layer is subjected to hydrogenating treatment so that dangling bonds, which are principal defects present at the grain boundaries, are terminated by hydrogen, thereby removing the dangling bonds.

The conventional method will be explained below with reference to FIG. 6, which shows the process sequence for producing a TFT.

As shown in FIG. 6A, a glass substrate 111 has a gate 112 provided thereon. The glass substrate 11 further has an anodized layer 113, a protective film 114 and a gate insulating film 115, which have been successively formed on the glass substrate 11 so as to cover the gate 12.

First, an amorphous silicon film (116) is deposited on the gate insulating film 115 by a chemical vapor deposition (hereinafter referred to as a "CVD") method.

Then, the amorphous silicon film (116) is crystallized by a laser crystallizing method using excimer laser light to form a poly-Si film 117.

Then, a silicon oxide film 118 is deposited on the poly-Si film 117 by a CVD method.

Thereafter, as shown in FIG. 6B, the silicon oxide film (118) is patterned by a lithography technique and etching process to form an etching stop pattern 119 of the silicon oxide film (118) on the poly-Si film 117 directly above the gate 112.

Then, as shown in FIG. 6C, an n-type impurity-containing silicon film 120 and a metal film 121 are successively deposited so as to cover the etching stop pattern 119 by a CVD method.

Thereafter, as shown in FIG. 6D, source-drain regions 122 and 123 are formed above the gate 112 and at both sides thereof from the metal film 121 and the silicon film 120 by a lithography technique and etching process.

Then, hydrogen (not shown) is introduced into the interface of the poly-Si film 117 in a region directly above the gate 112 through the etching stop pattern 119 by plasma hydrogenating treatment. Thus, dangling bonds are terminated by hydrogen and hence removed.

In this way, a TFT (Thin Film Transistor) 101 is formed.

The above-described TFT producing method and the TFT formed by the conventional method suffer, however, from the following problems:

Since hydrogen is supplied to the poly-Si film only through the etching stop pattern, it is difficult to supply hydrogen to the entire poly-Si film, and hence the resistance of the film becomes disadvantageously high.

Further, the activation annealing treatment for the source/drain regions must be carried out at high temperature.

In addition, since an electric field is likely to concentrate on a region in the vicinity of the drain region, the amount of leakage current is disadvantageously large.

SUMMARY OF THE INVENTION

An object of the present invention is to provide a thin film transistor which is excellent in carrier mobility characteristics and leakage current characteristics.

Another object of the present invention is to provide a method of producing the thin film transistor.

To attain the first object, the present invention provides a thin film transistor which includes a substrate having insulating properties at least at a surface thereof. On the substrate are formed a gate and an insulating film, including a gate insulating film, which covers the gate. A hydrogenated polycrystalline silicon film is formed over the substrate, including the gate, with the insulating film interposed therebetween. Further, a silicon oxide film pattern is formed on the polycrystalline silicon film directly above the gate. Source/drain regions are formed on the polycrystalline silicon film substantially at two external sides, respectively, of the pattern. The source/drain regions are formed from a hydrogen-containing amorphous silicon film, a conductive silicon film and a metal film, which are successively stacked on the polycrystalline silicon film.

The thin film transistor is produced by the following method: At the first step, an insulating film including at least a gate insulating film is formed over the insulating surface of a substrate so that the gate insulating film covers a gate formed on the substrate surface. Thereafter, a polycrystalline silicon film is formed on the upper surface of the insulating film. At the second step, a silicon oxide film is deposited on the polycrystalline silicon film and then patterned to form a silicon oxide film pattern directly above the gate. At the third step, a hydrogen-containing amorphous silicon film, a conductive silicon film and a metal film are successively deposited on the polycrystalline silicon film so as to cover the silicon oxide film pattern. At the fourth step, hydrogen in the amorphous silicon film is introduced into the polycrystalline silicon film, and also conductive impurities in the conductive silicon film are activated by heat treatment. Finally, at the fifth step, the metal film, the conductive silicon film and the amorphous silicon film are patterned to form source/drain regions.

The third step may be modified as follows: After an amorphous silicon film has been deposited on the polycrystalline silicon film so as to cover the silicon oxide film pattern, hydrogen ions are implanted into the amorphous silicon film and, at the same time, conductive impurity ions are implanted into a surface layer of the amorphous silicon film by ion doping, and thereafter, the metal film is formed.

The third step may also be modified as follows: Hydrogen ions and conductive impurity ions are implanted into the amorphous silicon film by plasma doping in place of the ion doping, and thereafter, the metal film is formed.

In the thin film transistor having the above-described arrangement, since the source/drain regions are formed from an amorphous silicon film, a conductive silicon film and a metal film, the amorphous silicon film functions as an offset region. Accordingly, the thin film transistor has an offset structure, and therefore, the leakage current is reduced by the relaxation of the electric field in the vicinity of the drain region.

Further, since the hydrogenated polycrystalline silicon film is formed over the gate with the insulating film interposed therebetween, dangling bonds in the polycrystalline silicon film are replaced by hydrogen and thus removed. Therefore, the carrier mobility in the channel region formed from the polycrystalline silicon film is improved.

With the above-described thin film transistor producing method, a hydrogen-containing amorphous silicon film, a conductive silicon film and a metal film are successively deposited on a polycrystalline silicon film so as to cover a silicon oxide film pattern formed on the polycrystalline silicon film, and thereafter, hydrogen in the amorphous silicon film is diffused into the polycrystalline silicon film. Therefore, the polycrystalline silicon film is effectively hydrogenated over the entire area thereof. Accordingly, the resistance of the source/drain regions is advantageously lowered.

With the first modification of the method of the present invention, in which, after the amorphous silicon film has been deposited on the polycrystalline silicon film so as to cover the silicon oxide film pattern at the third step, hydrogen ions are implanted into the amorphous silicon film by ion doping, hydrogen ions can be introduced into the amorphous silicon film at an advantageously high dose.

With the second modification of the method of the present invention, in which conductive impurity ions are introduced into the amorphous silicon film by plasma doping, it becomes easy to introduce conductive impurity ions into the surface layer of the amorphous silicon film.

With the first and second modifications, since conductive impurity ions are introduced, together with hydrogen ions, into the amorphous silicon film, the conductive impurity ions are activated by a low-temperature annealing treatment carried out at a temperature not higher than 400° C. Accordingly, a low-temperature process can be realized. Further, since it is unnecessary to deposit a conductive silicon film, a conductive silicon film deposition step can be omitted.

The above and other objects, features and advantages of the present invention will become more apparent from the following description of the preferred embodiments thereof, taken in conjunction with the accompanying drawings, in which like reference numerals denote like elements.

DETAILED DESCRIPTION OF THE PREFERRED EMBODIMENTS

Figure 1:
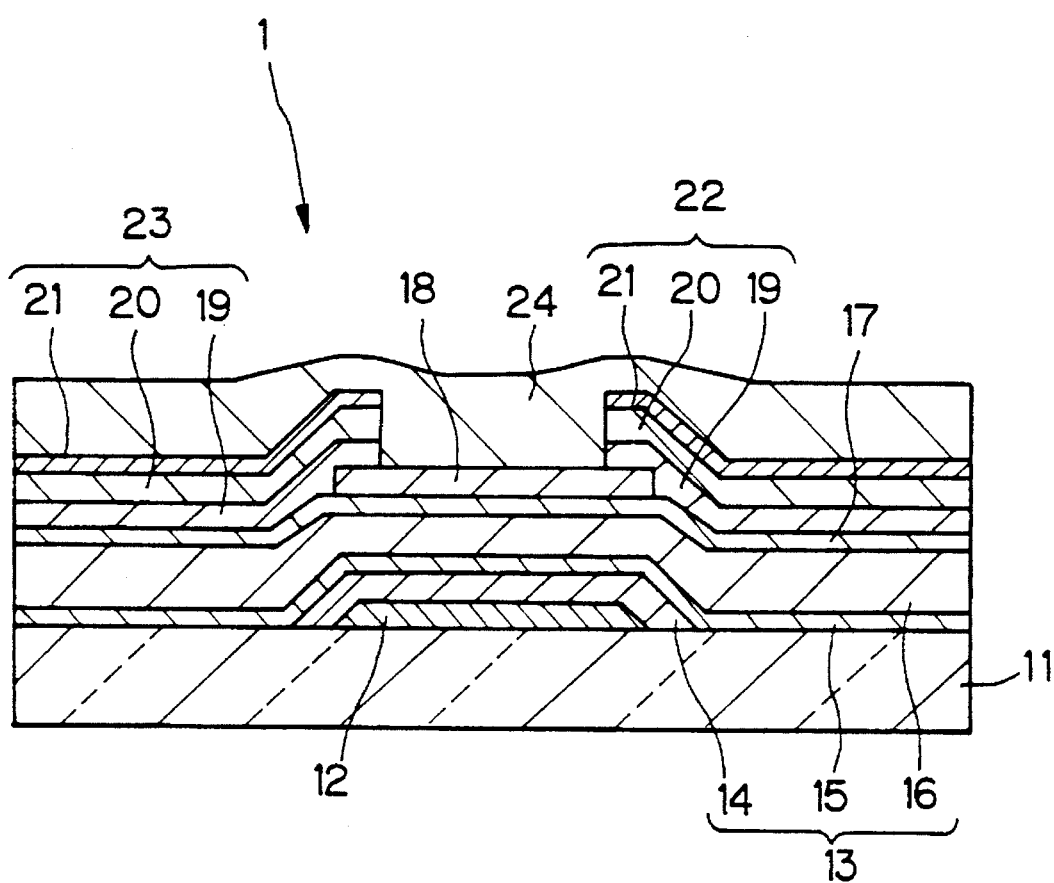
FIG. 1 is a sectional view schematically showing the arrangement of one embodiment of the thin film transistor according to the present invention.

One embodiment of the thin film transistor according to the present invention will be described below with reference to FIG. 1, which is a sectional view schematically showing the arrangement of the embodiment.

As shown in the figure, a substrate 11 having insulating properties at least at a surface thereof has a gate 12 formed on a part of the surface thereof. The substrate 11 is, for example, a glass substrate. The gate 12 is formed of a metal, for example, one selected from among molybdenum (Mo), tantalum (Ta), chromium (Cr), copper (Cu), titanium (Ti), and aluminum (Al), or an alloy of a plurality of metals selected from among them. For example, the gate 12 is formed of a molybdenum-tantalum alloy (MoTa).

An insulating film 13, which is composed of a plurality of layers, is formed over the substrate 11 so as to cover the gate 12. The insulating film 13 includes an oxide film 14, which is formed by anodizing a surface layer of the gate 12, a silicon nitride film 15, which is deposited over the substrate 11 to protect it, and a gate insulating film 16, which is a silicon oxide film deposited on the surface of the silicon nitride film 15. The oxide film 14 may be formed by plasma oxidation.

Further, a polycrystalline silicon film 17 is deposited on the upper surface of the gate insulating film 16. The polycrystalline silicon film 17 is, for example, formed by transforming an amorphous silicon film by a laser crystallizing method.

A silicon oxide film pattern 18 is formed on the polycrystalline silicon film 17 directly above the gate 12. The silicon oxide film pattern 18 is formed by using a material which can serve as an etching stop layer when source/drain regions are formed and which is permeable to hydrogen.

Source/drain regions 22 and 23 are formed on the polycrystalline silicon film 17 substantially at two external sides of the silicon oxide film pattern 18. The source/drain regions 22 and 23 are formed from a hydrogen- containing amorphous silicon (hereinafter referred to as "a-Si:H") film 19, a conductive silicon film 20 and a metal film 21, which are successively stacked on the polycrystalline silicon film 17.

Further, a passivation film 24 of silicon nitride is formed over the source/drain regions 22 and 23 and the gap therebetween.

The thin film transistor 1 of this embodiment is arranged as described above.

The thin film transistor 1, arranged as described above, has the following advantages: Since the hydrogenated polycrystalline silicon film 17 is formed over the gate 12 with the insulating film 13 interposed therebetween, dangling bonds present at the interface of the polycrystalline silicon film 17 are replaced by hydrogen and thus removed. Therefore, the carrier mobility in the channel region is improved.

Further, since the source/drain regions 22 and 23 are formed from the a-Si:H film 19, the conductive silicon film 20 and the metal film 21, the a-Si:H film 19 functions as an offset region. Accordingly, the thin film transistor 1 has an offset structure, and therefore, the leakage current is reduced by the relaxation of the electric field in the vicinity of the source/drain region 22 (or 23), which functions as a drain.

Next, a method of producing the thin film transistor 1 will be explained with reference to FIGS. 2A to 3B, which show the production process sequence (part 1 and part 2).

It should be noted that in these figures constituent elements similar to those described in connection with FIG. 1 are denoted by the same reference numerals.

Figure 2A:
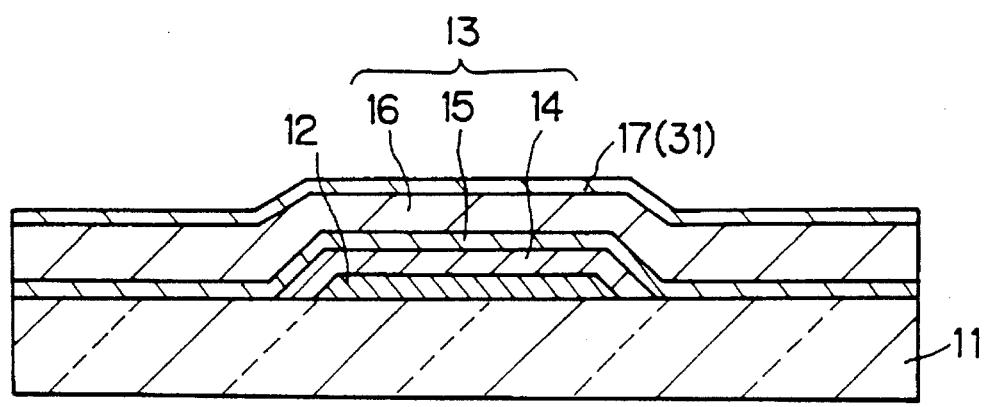
FIGS. 2A to 2C show the process sequence (part 1) for producing a thin film transistor according to one embodiment of the present invention.

As shown in FIG. 2A, a substrate 11 having insulating properties at least at a surface thereof, e.g. a glass substrate, has a gate 12 of a molybdenum-tantalum alloy (MoTa) formed on the surface thereof. The gate 12 may be formed of a metal, for example, one selected from among molybdenum (Mo), tantalum (Ta), chromium (Cr), copper (Cu), titanium (Ti), and aluminum (Al), or an alloy of a plurality of metals selected from among them.

An insulating film 13, which is composed of a plurality of layers, is formed over the substrate 11 so as to cover the gate 12. The insulating film 13 includes an oxide film 14, which is formed by anodizing a surface layer of the gate 12, a silicon nitride film 15 which is deposited over the substrate 11 to protect it, and a gate insulating film 16, which is a silicon oxide film deposited on the surface of the silicon nitride film 15.

At the first step, an amorphous silicon film (31) is deposited on the insulating layer 13 by a film deposition technique represented by chemical vapor deposition (hereinafter referred to as "CVD"), for example. Thereafter, the amorphous silicon film (31) is irradiated with excimer laser light by a laser crystallizing method to transform it into a polycrystalline silicon film 17.

Figure 2B:
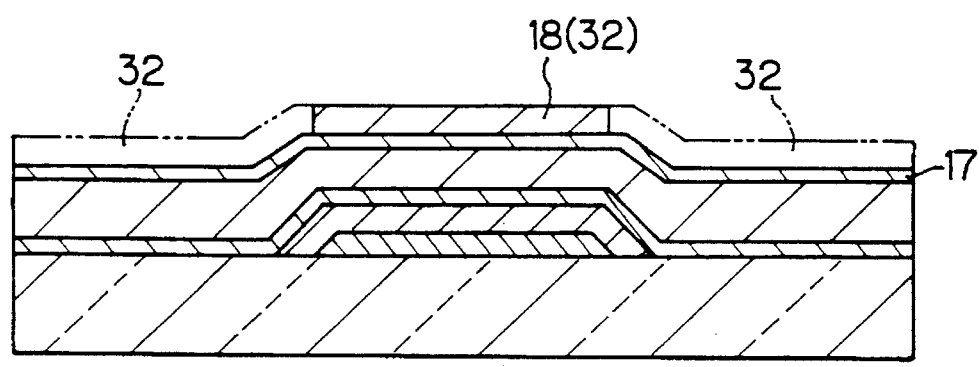

Then, the second step shown in FIG. 2B is carried out. At this step, a silicon oxide film 32 is deposited on the polycrystalline silicon film 17 by a film deposition technique, e.g., CVD, evaporation, sputtering, etc.

Thereafter, the portion of the silicon oxide film 32 that is shown by the two-dot chain line is removed by a lithography technique and etching process, thereby forming a silicon oxide film pattern 18 of the silicon oxide film (32) left on the polycrystalline silicon film 17 directly above the gate 12.

Although in this embodiment the pattern 18 is formed from a silicon oxide film, it may be formed by using other material as long as it is permeable to hydrogen.

Figure 2C:
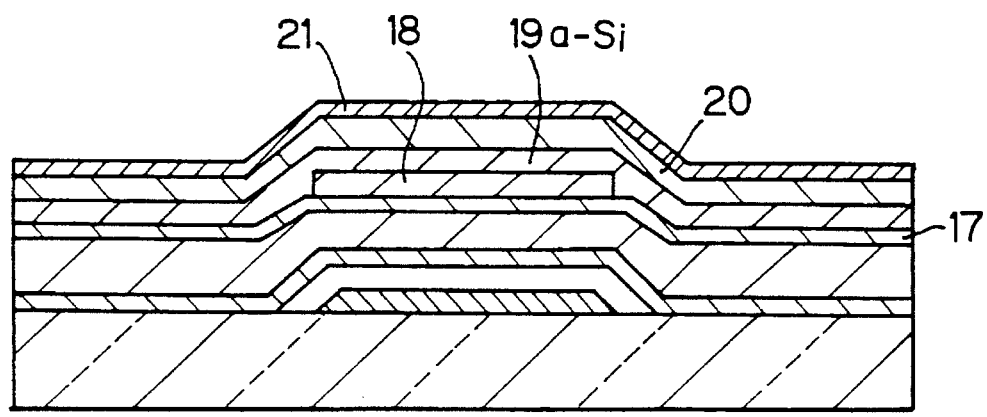

Subsequently, the third step shown in FIG. 2C is carried out. At this step, a hydrogen-containing amorphous silicon film (hereinafter referred to as "a-Si:H") film 19 is deposited on the polycrystalline silicon film 17 so as to cover the silicon oxide film pattern 18 by, for example, CVD; in this embodiment, PECVD is carried out at a film deposition temperature not higher than 250° C.

Then, a conductive silicon film 20 is deposited on the a-Si:H film 19 by a film deposition method, e.g., CVD, evaporation, sputtering, etc. The conductive silicon film 20 is a silicon film containing n- or p-type impurities.

Thereafter, a metal film 21 is formed on the conductive silicon film 20 by a film deposition method, e.g., CVD, evaporation, sputtering, etc.

Figure 3A:
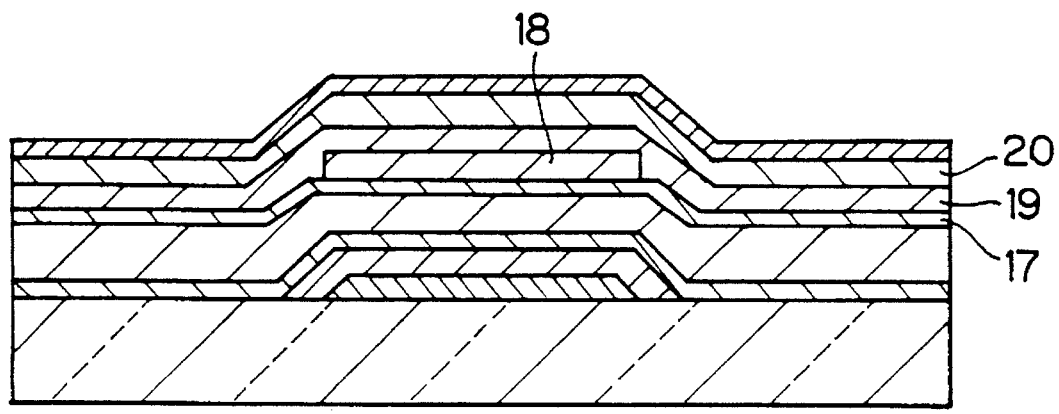
FIGS. 3A and 3B show the process sequence (part 2) for producing a thin film transistor according to one embodiment of the present invention.

Thereafter, the fourth step shown in FIG. 3A is carried out. At this step, hydrogen in the a-Si:H film 19 is diffused into the polycrystalline silicon film 17 by heat treatment, thereby hydrogenating the polycrystalline silicon film 17. At the same time, conductive impurities in the conductive silicon film 20 are activated. The heat treatment is carried out at a temperature not higher than 400° C., e.g. 375° C.

Figure 3B:
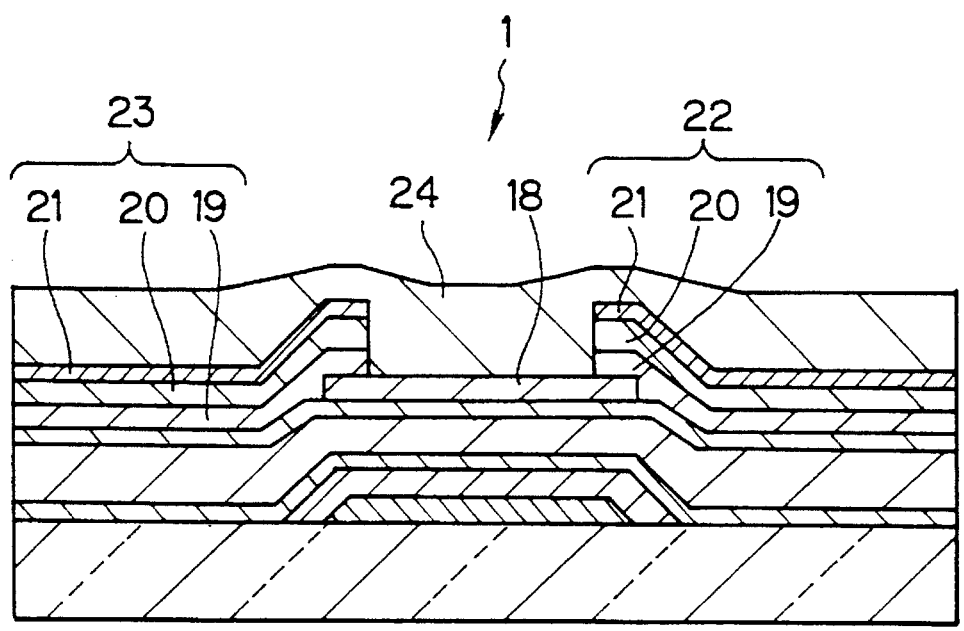

Then, the fifth step shown in FIG. 3B is carried out. At this step, the metal film 21, the conductive silicon film 20 and the a-Si:H film 19 are patterned by a lithography technique and etching process to form source/drain regions 22 and 23, which are composed of these three films, substantially at two external sides of the silicon oxide film pattern 18.

Further, a passivation film 24 of silicon nitride is deposited by CVD so as to cover the silicon oxide film pattern 18 and the source/drain regions 22 and 23.

Thus, the thin film transistor 1 is produced.

According to the above-described thin film transistor producing method, first, the silicon oxide film pattern 18 is formed on the polycrystalline silicon film 17, and then the a-Si:H film 19, the conductive silicon film 20 and the metal film 21 are deposited in the mentioned order on the polycrystalline silicon film 17 so as to cover the silicon oxide film pattern 18, and thereafter, hydrogen in the a-Si:H film 19 is diffused into the polycrystalline silicon film 17. Therefore, the polycrystalline silicon film 17 is effectively hydrogenated over the entire area thereof. It is generally known that hydrogen permeates through the silicon oxide well. Therefore, hydrogen in the a-Si:H film 19 passes through the silicon oxide film pattern 18. Accordingly, hydrogen is also introduced into a portion of the polycrystalline silicon film 17 which is covered by the silicon oxide film pattern 18. Therefore, grain boundaries in that portion of the polycrystalline silicon film 17 are passivated, and the resistance is favorably lowered.

It should be noted that the method of diffusing hydrogen into the polycrystalline silicon film 17 using an a-Si:H film can also be applied to a conventional process in which hydrogen is diffused into a polycrystalline silicon film by using a hydrogen-containing silicon nitride film.

More specifically, hydrogen is diffused by using an a-Si:H film in place of the hydrogen-containing silicon nitride film, and thereafter, the a-Si:H film is removed. Then, a silicon nitride film serving as a passivation film is formed.

The third step in the above-described production method may be carried out as follows: The modification will be explained below with reference to FIGS. 4A to 4C, which show the process sequence.

It should be noted that constituent elements similar to those described in connection with FIGS. 1 to 3B are denoted by the same reference numerals.

Figure 4A:
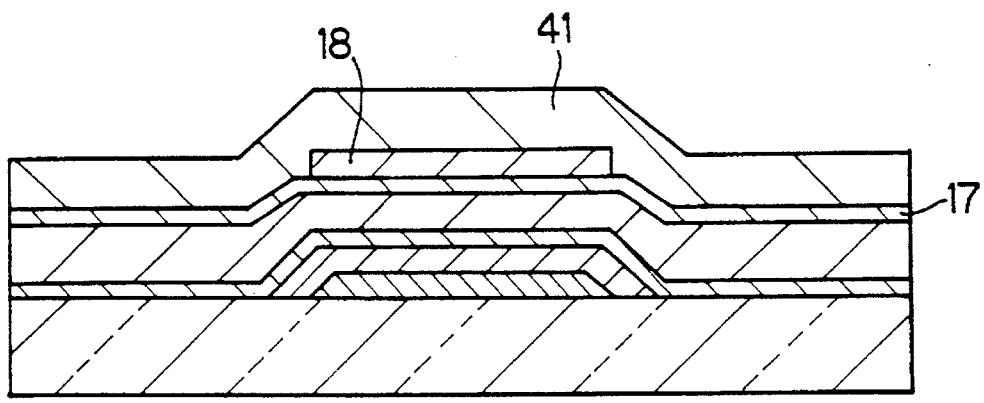
FIGS. 4A to 4C show a modification of the third step of the thin film transistor producing method according to the present invention.

As shown in FIG. 4A, an amorphous silicon film 41 is deposited on the polycrystalline silicon film 17 so as to cover the silicon oxide film pattern 18.

Figure 4B:
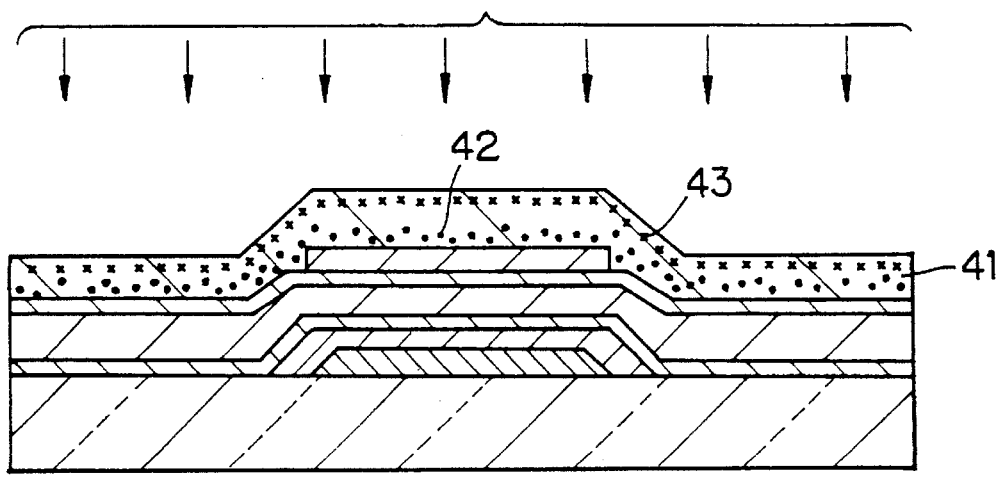

Thereafter, as shown in FIG. 4B, hydrogen ions 42 are implanted into the amorphous silicon film 41 by an ion doping technique, e.g. ion implantation. Together with the hydrogen ions 42, conductive impurity ions 43 are implanted into a surface layer of the amorphous silicon film 41. Typical examples of n-type impurities usable as the conductive impurity ions 43 are phosphorus ions ($P^+$), arsenic ions ($As^+$) and antimony ions ($Sb^+$). Typical p-type conductive impurities usable are boron ions ($B^+$). The conductive impurity ions 43 are implanted at a relatively low energy in the range of about 1 keV to 5 keV.

Figure 4C:
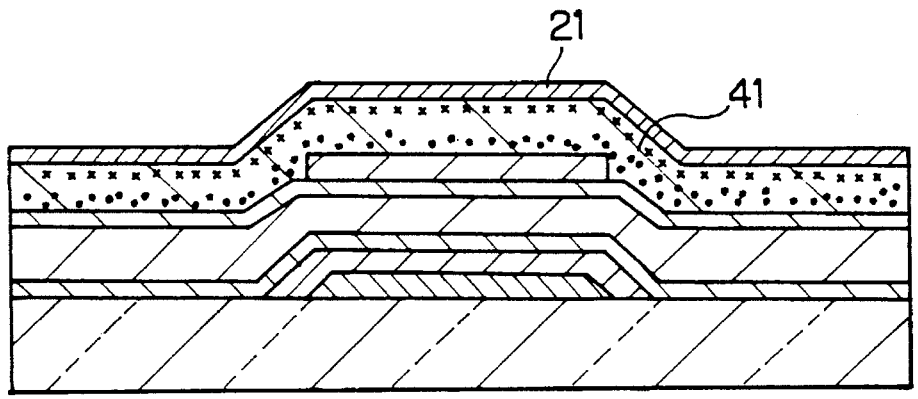

Then, as shown in FIG. 4C, a metal film 21 is formed on the upper surface of the amorphous silicon film 41 by a film deposition technique, e.g., CVD, evaporation, sputtering, etc.

The above-described process of the third step enables hydrogen ions 42 to be introduced into the amorphous silicon film 41 at a dose substantially equal to that in, at least, silicon nitride film because the hydrogen ions 42 are implanted into the amorphous silicon film 41 by an ion doping technique.

Further, since the hydrogen ions 42 and the conductive impurity ions 43 are implanted into the amorphous silicon film 41, the activation annealing treatment can be carried out at a temperature not higher than 400° C. Accordingly, a low-temperature process can be realized.

Further, since no conductive silicon film is needed, the deposition process for a conductive silicon film can be omitted.

The third step in the production method, which has been explained in connection with FIGS. 2A to 3B, may also be carried out as follows: The modification will be explained below with reference to FIGS. 5A to 5C, which show the process sequence.

It should be noted that constituent elements similar to those explained in connection with FIGS. 4A to 4C are denoted by the same reference numerals.

Figure 5A:
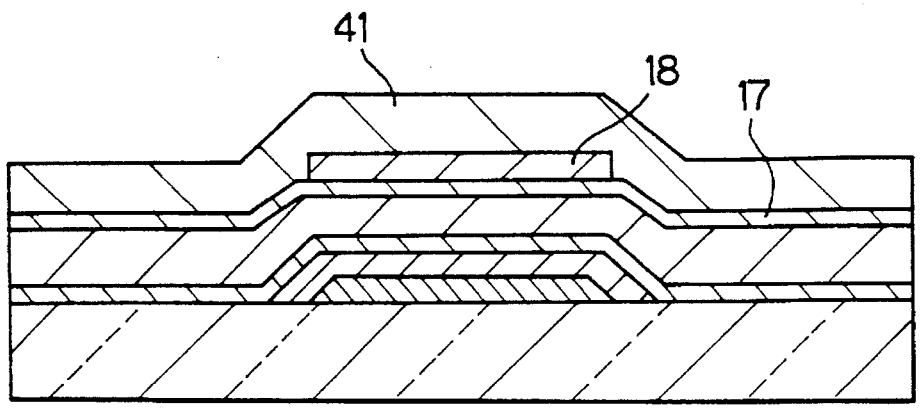
FIGS. 5A to 5C show another modification of the third step of the thin film transistor producing method according to the present invention.

As shown in FIG. 5A, an amorphous silicon film 41 is deposited on the polycrystalline silicon film 17 so as to cover the silicon oxide film pattern 18.

Figure 5B:
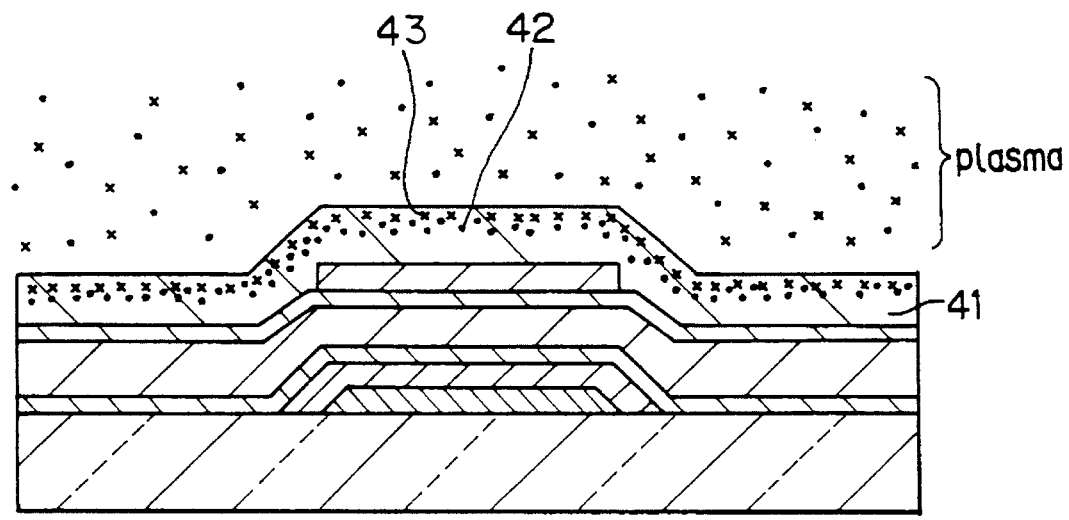

Thereafter, as shown in FIG. 5B, hydrogen ions 42 are implanted into the amorphous silicon film 41, and at the same time, conductive impurity ions 43 are implanted into a surface layer of the amorphous silicon film 41 by plasma doping.

Figure 5C:
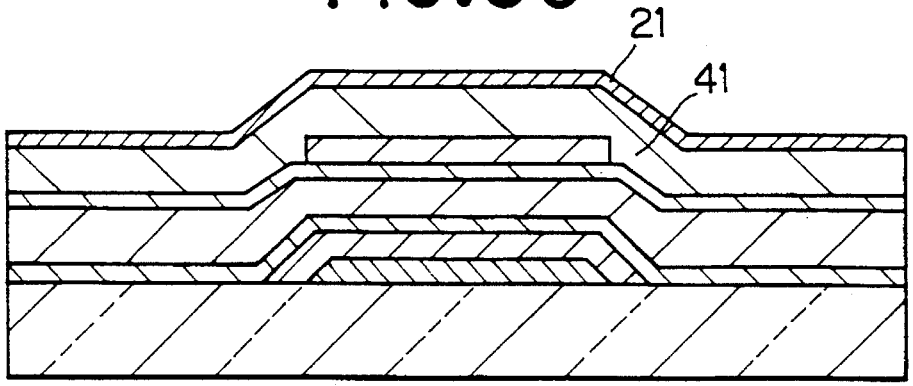
Figure 6A:
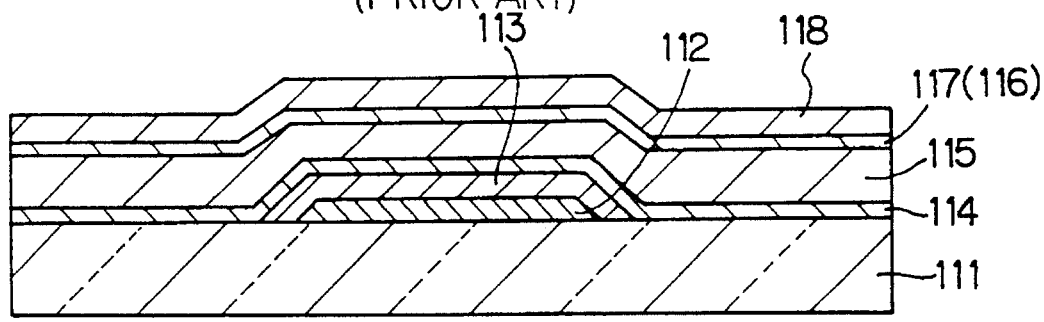
FIGS. 6A to 6D show the process sequence for producing a thin film transistor according to a conventional technique.
Figure 6B:
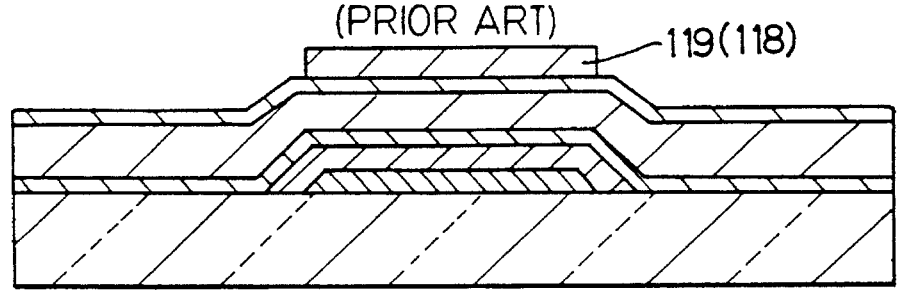
Figure 6C:
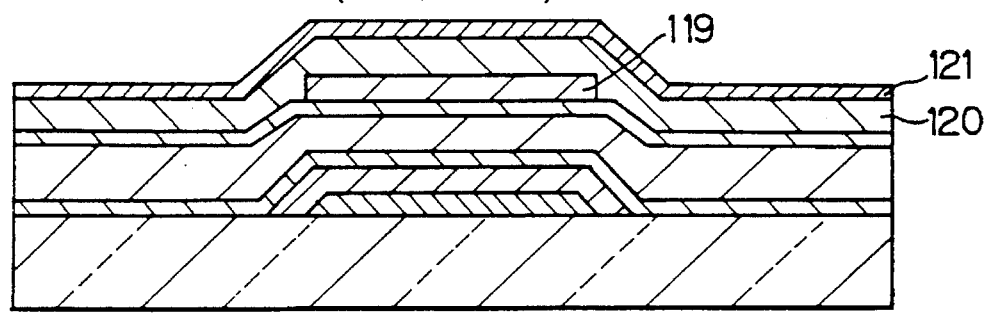
Figure 6D:
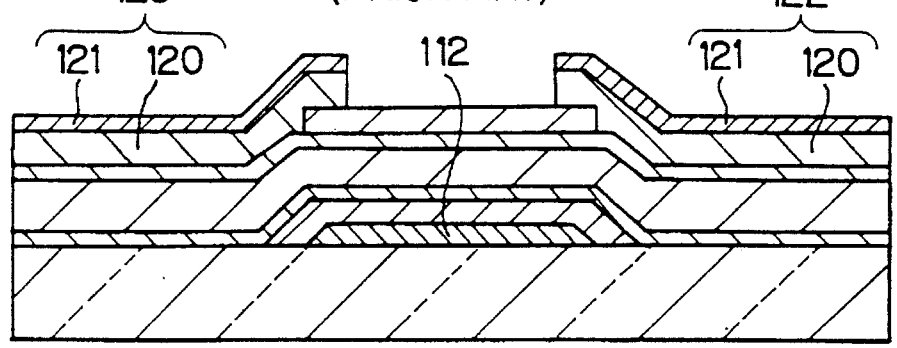

Then, as shown in FIG. 5C, a metal film 21 is formed on the upper surface of the amorphous silicon film 41 by a film deposition technique, e.g. CVD, evaporation, sputtering, etc.

The process of the third step, described in connection with FIGS. 5A to 5C, enables the conductive impurity ions 43 to be readily introduced into a surface layer of the amorphous silicon film 41 because they are introduced at the same time as the hydrogen ions 42 are introduced into the amorphous silicon film 41 by plasma doping.

Further, it is possible to obtain advantages similar to those offered by the first-mentioned modification of the process of the third step.

That is, since the hydrogen ions 42 and the conductive impurity ions 43 are implanted into the amorphous silicon film 41, the activation annealing treatment can be carried out at a temperature not higher than 400° C. Accordingly, a low-temperature process can be realized.

Further, since no conductive silicon film is needed, the deposition process for a conductive silicon film can be omitted.

As has been described above, according to the thin film transistor of the present invention, since the source/drain regions are formed from an amorphous silicon film, a conductive silicon film and a metal film, the amorphous silicon film functions as an offset region. Accordingly, the thin film transistor has an offset structure, and therefore, the leakage current can be reduced by the relaxation of the electric field in the vicinity of the drain region.

Further, since the hydrogenated polycrystalline silicon film is formed over the gate with the insulating film interposed therebetween, dangling bonds in the polycrystalline silicon film can be terminated by hydrogen. Therefore, the carrier mobility in the channel region can be improved.

According to the thin film transistor producing method, after a hydrogen-containing amorphous silicon film is deposited on a polycrystalline silicon film, hydrogen in the amorphous silicon film is diffused into the polycrystalline silicon film. Therefore, the polycrystalline silicon film is effectively hydrogenated over the entire area thereof. Accordingly, the resistance of the source/drain regions is advantageously lowered.

With the first modification of the method according to the present invention, since hydrogen ions are implanted into the amorphous silicon film by ion doping, hydrogen ions can be introduced into the amorphous silicon film at an advantageously high dose. Accordingly, the polycrystalline silicon film can be readily and satisfactorily hydrogenated. Since dangling bonds in the polycrystalline silicon film can be satisfactorily passivated in this way, the mobility of carriers in the channel region can be improved.

With the second modification of the method according to the present invention, since conductive impurity ions are introduced into the amorphous silicon film by plasma doping, it becomes easy to introduce conductive impurity ions into the surface layer of the amorphous silicon film. Since no conductive impurity ions are diffused into the lower layer of the amorphous silicon film, the lower region functions as an offset region.

Since the first and second modifications enable conductive impurity ions to be introduced, together with hydrogen ions, into the amorphous silicon film, the conductive impurity ions are activated by low-temperature annealing treatment carried out at a temperature not higher than 400° C. Accordingly, a low-temperature process can be realized.

Although the present invention has been described through specific terms, it should be noted here that the described embodiments are not necessarily exclusive and that various changes and modifications may be imparted thereto without departing from the scope of the invention which is limited solely by the appended claims.

What is claimed is:

1. A method of producing a thin film transistor, comprising the steps of:

providing a substrate having insulating properties and providing a gate on a surface of the substrate;

forming an insulating film, including at least a gate insulating film, over the substrate and gate, and then forming a polycrystalline silicon film on an upper surface of said insulating film;

depositing a silicon oxide film on said polycrystalline silicon film, and then patterning said silicon oxide film to form a silicon oxide film pattern on said polycrystalline silicon film directly above said gate;

successively forming a hydrogen-containing amorphous silicon film, a conductive silicon film, and a metal film on said polycrystalline silicon film so as to cover said silicon oxide film pattern;

introducing hydrogen from said amorphous silicon film into said polycrystalline silicon film, and also activating conductive impurities in said conductive silicon film by heat treatment; and patterning said metal film, said conductive silicon film, and said amorphous silicon film to form source/drain regions.

2. A thin film transistor according to claim 1 wherein after said amorphous silicon film has been deposited on said polycrystalline silicon film so as to cover said silicon oxide film pattern, implanting hydrogen ions into said amorphous silicon film and, at a same time, implanting conductive impurity ions into a surface layer of said amorphous silicon film by ion doping, and thereafter forming said metal film.

3. A thin film transistor according to claim 1 wherein after said amorphous silicon film has been deposited on said polycrystalline silicon film so as to cover said silicon oxide film pattern, introducing hydrogen ions and conductive impurity ions into said amorphous silicon film by plasma doping, and thereafter, forming said metal film.

4. A method of producing a thin film transistor, comprising the steps of:

provasion a substrate having insulating properties and providing a gate on a surface of the substrate;

forming an insulating film over the substrate and gate, and then forming a polycrystalline silicon film on an upper surface of said insulating film;

depositing a silicon oxide film on said polycrystalline silicon film, and then patterning said silicon oxide film to form a silicon oxide film pattern on said polycrystalline silicon film above said gate;

successively forming a hydrogen-containing amorphous silicon film, a conductive silicon film, and a metal film on said polycrystalline silicon film so as to cover said silicon oxide film pattern;

introducing hydrogen from said amorphous silicon film into said polycrystalline silicon film, and also activating conductive impurities in said conductive silicon film by heat treatment; and patterning said metal film, said conductive silicon film, and said amorphous silicon film to form source/drain regions.

* * * * *